(12) United States Patent
Guo

(10) Patent No.: US 9,237,666 B2
(45) Date of Patent: Jan. 12, 2016

(54) FOLDING ELECTRONIC DEVICE WITH RETRACTING LOCKING MECHANISM

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Ji-Bing Guo, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 414 days.

(21) Appl. No.: 13/846,934

(22) Filed: Mar. 18, 2013

(65) Prior Publication Data

US 2013/0250501 A1 Sep. 26, 2013

(30) Foreign Application Priority Data

Mar. 20, 2012 (CN) .......................... 2012 1 0074139

(51) Int. Cl.
*H05K 5/02* (2006.01)
*G06F 1/16* (2006.01)
*H04M 1/02* (2006.01)

(52) U.S. Cl.
CPC ............ *H05K 5/0221* (2013.01); *G06F 1/1616* (2013.01); *G06F 1/1679* (2013.01); *H04M 1/0216* (2013.01)

(58) Field of Classification Search
CPC ...... H05K 5/0221; H05K 5/02; G06F 1/1679; G06F 1/1616; H04M 1/0216
USPC ...................... 361/679.58, 679.01; 292/251.5
See application file for complete search history.

(56) References Cited

U.S. PATENT DOCUMENTS

| | | | | |
|---|---|---|---|---|
| 5,580,107 A | * | 12/1996 | Howell ..................... | E05C 5/00 292/125 |
| 6,034,869 A | * | 3/2000 | Lin ......................... | 361/679.43 |
| 6,108,196 A | * | 8/2000 | Jung .................. | E05B 17/0037 292/102 |
| 6,256,194 B1 | * | 7/2001 | Choi et al. ............... | 361/679.58 |
| 7,181,238 B2 | * | 2/2007 | Chiang ...................... | 455/556.1 |

* cited by examiner

*Primary Examiner* — Dion R Ferguson
*Assistant Examiner* — Mandeep Buttar
(74) *Attorney, Agent, or Firm* — Novak Druce Connolly Bove + Quigg LLP

(57) ABSTRACT

A folding electronic device includes a first main body having a first housing, an engagement unit, a second main body engaged with the first main body, and a locking mechanism. The locking mechanism includes a hook member, a hook driving member, a first reset driving member, and a latch member. The hook member is fixed to the first main body. The latch member is fixed to the second main body. The hook driving member drives the hook member to protrude from the first housing to latch with the latch member when the electronic device is folded. The reset driving member retracts the hook member into the first housing when the electronic device is unfolded.

16 Claims, 11 Drawing Sheets

FOLDING ELECTRONIC DEVICE WITH RETRACTING LOCKING MECHANISM

BACKGROUND

1. Technical Field

The present disclosure relates to folding electronic devices, and more particular to a folding electronic device with a protected locking mechanism for locking the folding electronic device in a folded state.

2. Description of Related Art

Electronic devices, such as laptop computers, have two main bodies (e.g. a display body and a keyboard body) engaged with each other and a locking mechanism for locking the two main bodies together when the laptop computer is in a folded state. Generally, the locking mechanism includes a hook element and a latch element for the hook element. However, the hook element of the locking mechanism is usually exposed outside when the laptop computer is in an unfolded state, which leaves the hook element of the locking mechanism vulnerable to damage, and the reliability of the locking mechanism is thus reduced.

What is needed is a folding electronic device that can overcome the above-described limitations.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views, and all the views are schematic.

DETAILED DESCRIPTION

Reference will be made to the drawings to describe certain exemplary embodiments of the present disclosure.

Figure 1:
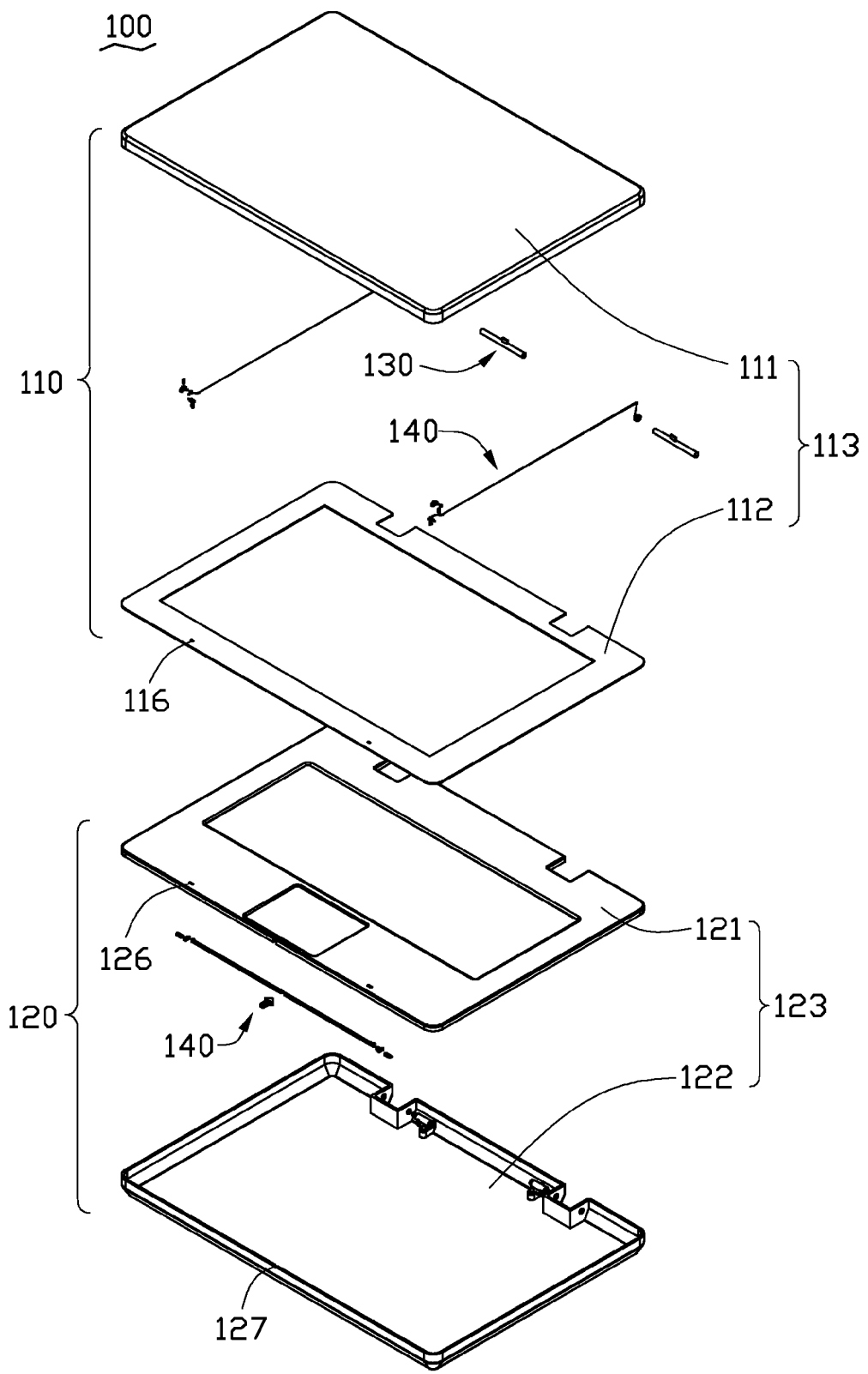
FIG. 1 is an exploded view of a folding electronic device according to one embodiment of the present disclosure, the folding electronic device including a locking mechanism.
Figure 2:
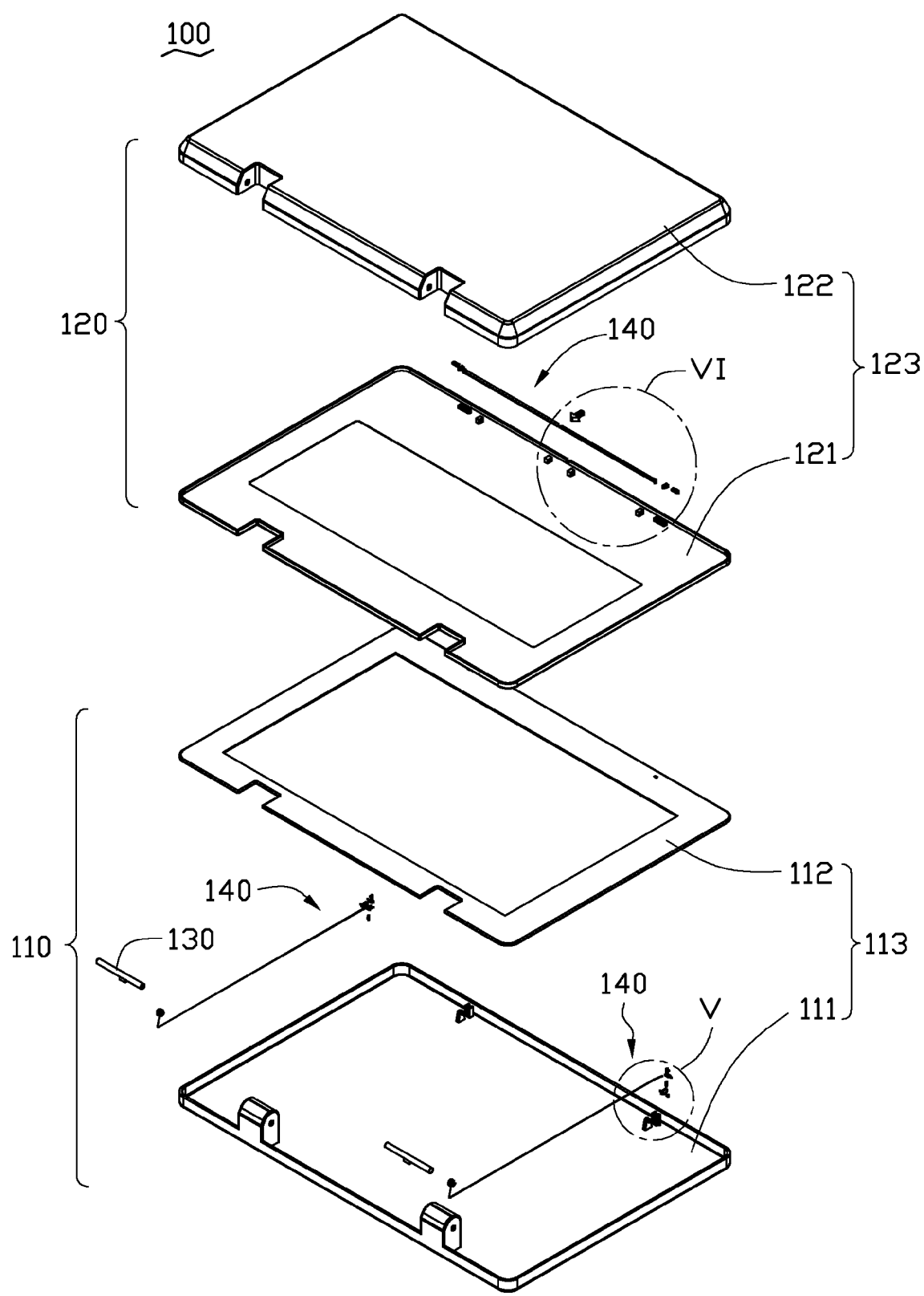
FIG. 2 is another exploded view of the folding electronic device of FIG. 1, but with the folding electronic device inverted.
Figure 3:
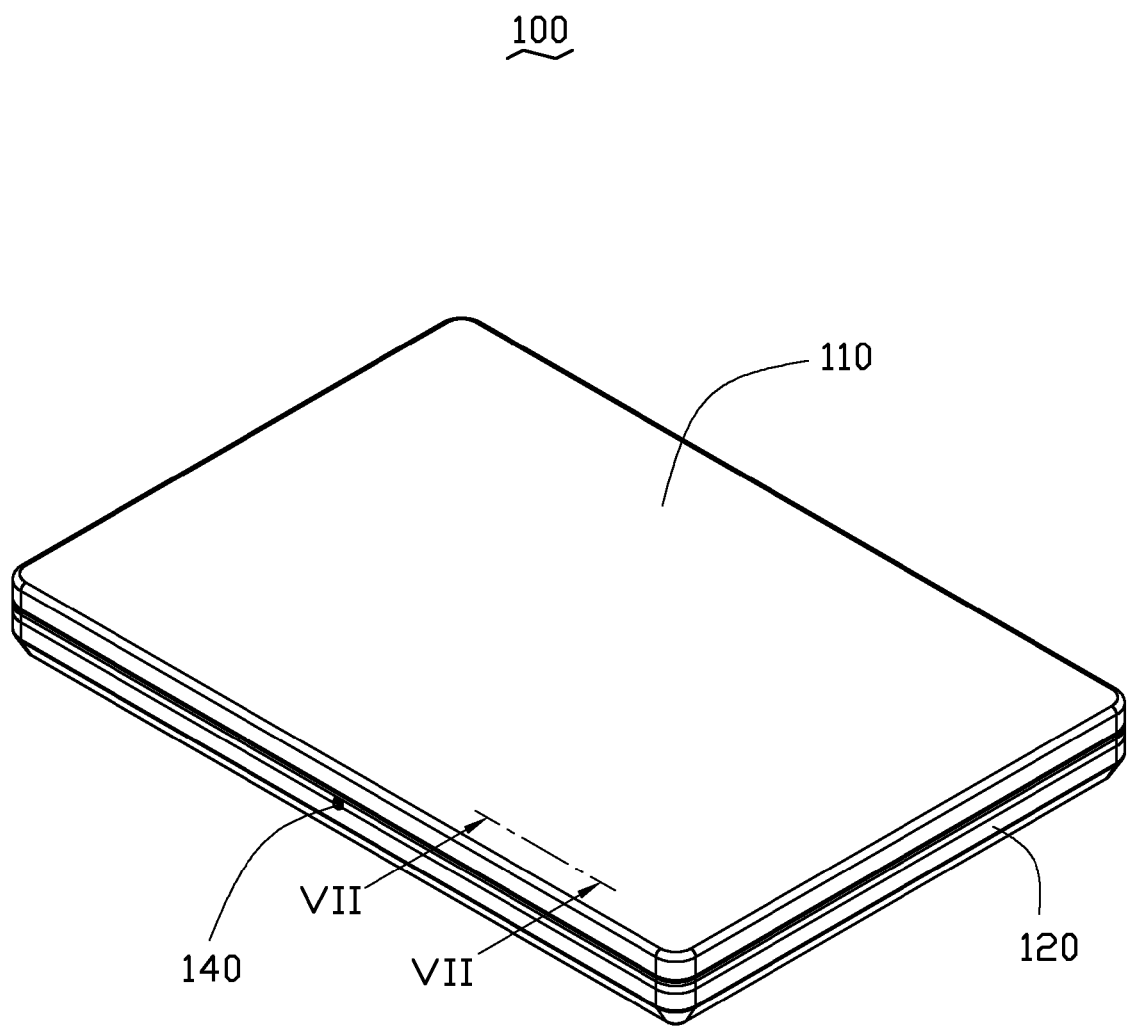
FIG. 3 is an assembled view of the folding electronic device of FIG. 1 in a folded state.
Figure 4:
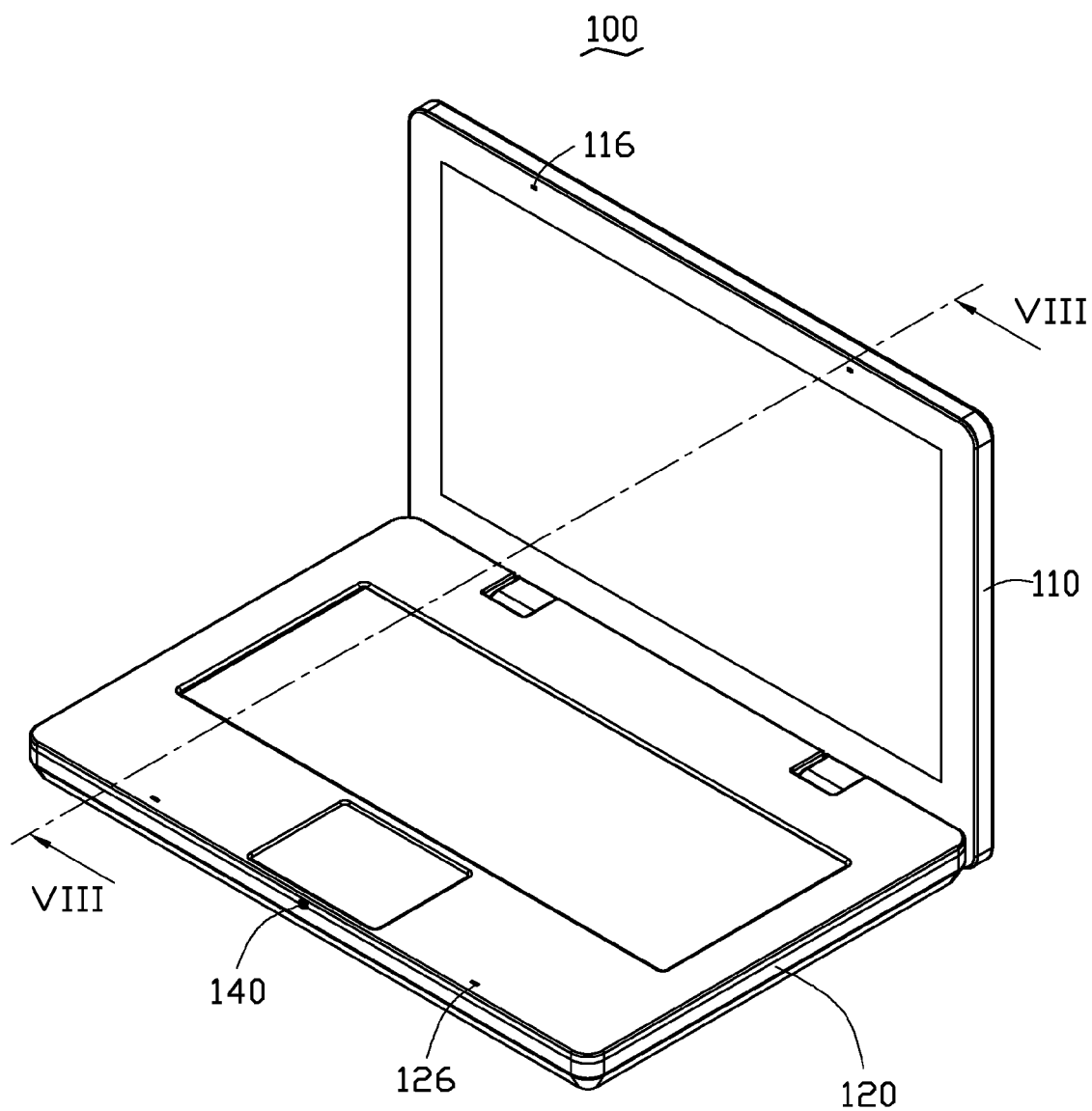
FIG. 4 is an assembled view of the folding electronic device of FIG. 1 in an unfolded state.

The present disclosure provides a folding electronic device, such as a laptop computer. FIGS. 1-2 show that the folding electronic device 100 includes a first main body 110, an engagement unit 130, a second main body 120 pivotably engaged with the first main body 110 via the engagement unit 130, and a locking mechanism 140 configured to lock the first main body 110 and the second main body 120 together. FIG. 3 shows the first main body 110 folded over the second main body 120 when the folding electronic device 100 is in a folded state. FIG. 4 shows the first main body 110 away from the second main body 120 when the folding electronic device 100 is in an unfolded state.

The first main body 110 can be a display body, and includes a first housing 113 having a first upper frame 111 and a first lower frame 112. The first upper frame 111 and the first lower frame 112 cooperatively form a receiving space for receiving a display panel (not shown) and a part of the lock mechanism 140. The first lower frame 112 includes an opening 116 exposing part of the lock mechanism 140. The second main body 120 can be a keyboard body, and includes a second housing 123 having a second upper frame 121 and a second lower frame 122. The second upper frame 121 and the second lower frame 122 cooperatively form a receiving space for receiving keyboard elements (not shown) and another part of the lock mechanism 140. The second upper frame 121 includes an opening 126, and the second lower frame 122 includes an opening 127. Another part of the lock mechanism 140 is exposed through the second housing 123 via the openings 126 and 127.

Figure 5:
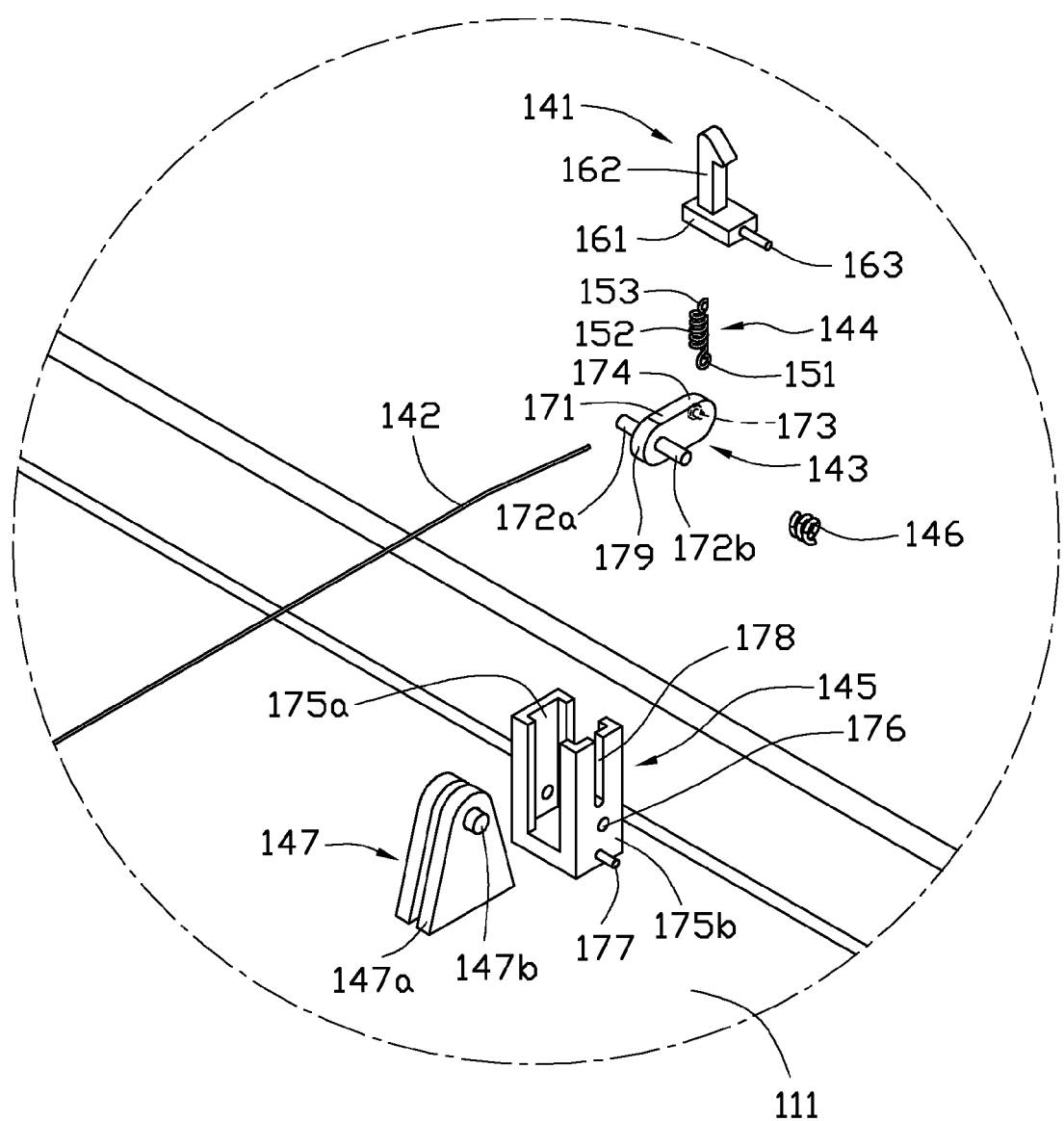
FIG. 5 is an enlarged view of part V of the locking mechanisms of FIG. 2.
Figure 6:
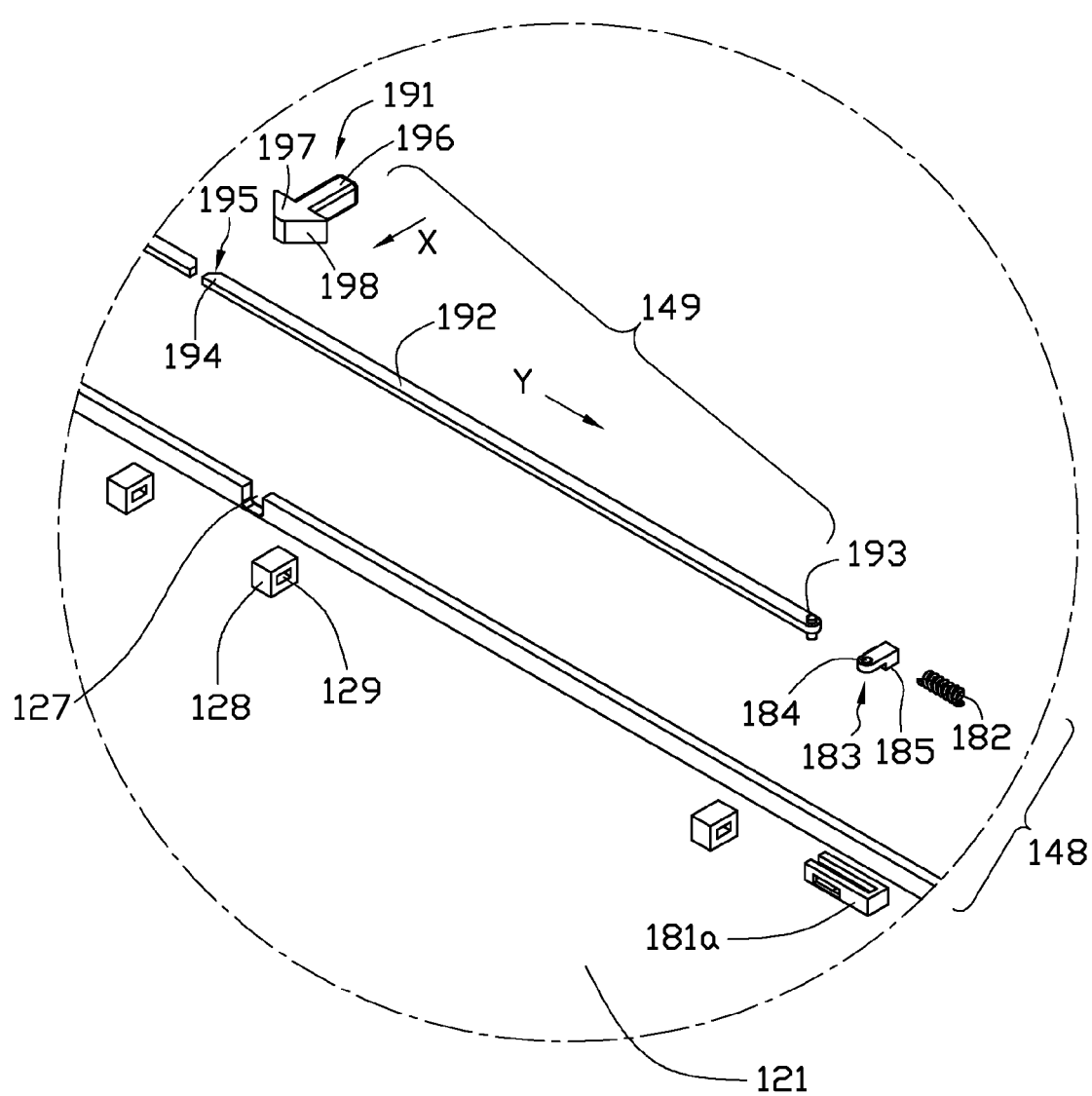
FIG. 6 is an enlarged view of part VI of the locking mechanisms of FIG. 2.

FIGS. 5-6 show that the locking mechanism 140 includes a hook member 141, a flexible connection member 142, a hook driving member 143, a first reset driving member 144, a fixing member 145, a second reset driving member 146, a guide member 147, a latch member 148, and an unlocking member 149.

The hook member 141 includes a base portion 161, a hook 162 extending from the base portion 161, and a first fixing portion 163 connected to the base portion 161. The hook driving member 143 includes a main portion 171, two pivot shafts 172a and 172b, and a connection portion 173. The main portion 171 includes a push end 174 and an opposite engagement end 179. The two pivot shafts 172a and 172b are located at opposite sides of the engagement end 179. The connection portion 173 is located at the push end 174. The first reset driving member 144 includes an elastic element having a first connection portion 151 and a second connection portion 153, and an elastic portion 152 connected between the first connection portion 151 and the second connection portion 153. The fixing member 145 includes two parallel fixing plates 175a and 175b extending from the first upper frame 111 and a fixing portion 177 located at the fixing plate 175b. Each fixing plate 175 defines a pivot hole 176, and the fixing plate 175b further defines a guide groove 178. The guide member 147 is located at the first upper frame 111, and includes two supporting plates 147a facing each other and a guide shaft 147b connecting the two supporting plates 147a.

The latch member 148 includes a latch element 183, an elastic element 182, and a positioning element 181. The latch element 183 includes a latch end 185 configured to latch with the hook 162 and an engagement end 184 configured to connect to the unlocking member 149. The positioning element 181 is located at the second upper frame 121 and defines a guide groove 181a. The unlocking member 149 includes an operation button 191, a link lever 192, and a guide block 128. The link lever 192 includes a first end 193, and an opposite second end 194 defining an inclined surface 195. The guide block 128 is located at the second upper frame 121 and defines a guide hole 129. The operation button 191 includes an operation portion 196 and a driving portion 197, and the driving portion 197 defines an inclined surface 198 corresponding to the inclined surface 195 of the opposite second end 194.

Figure 7:
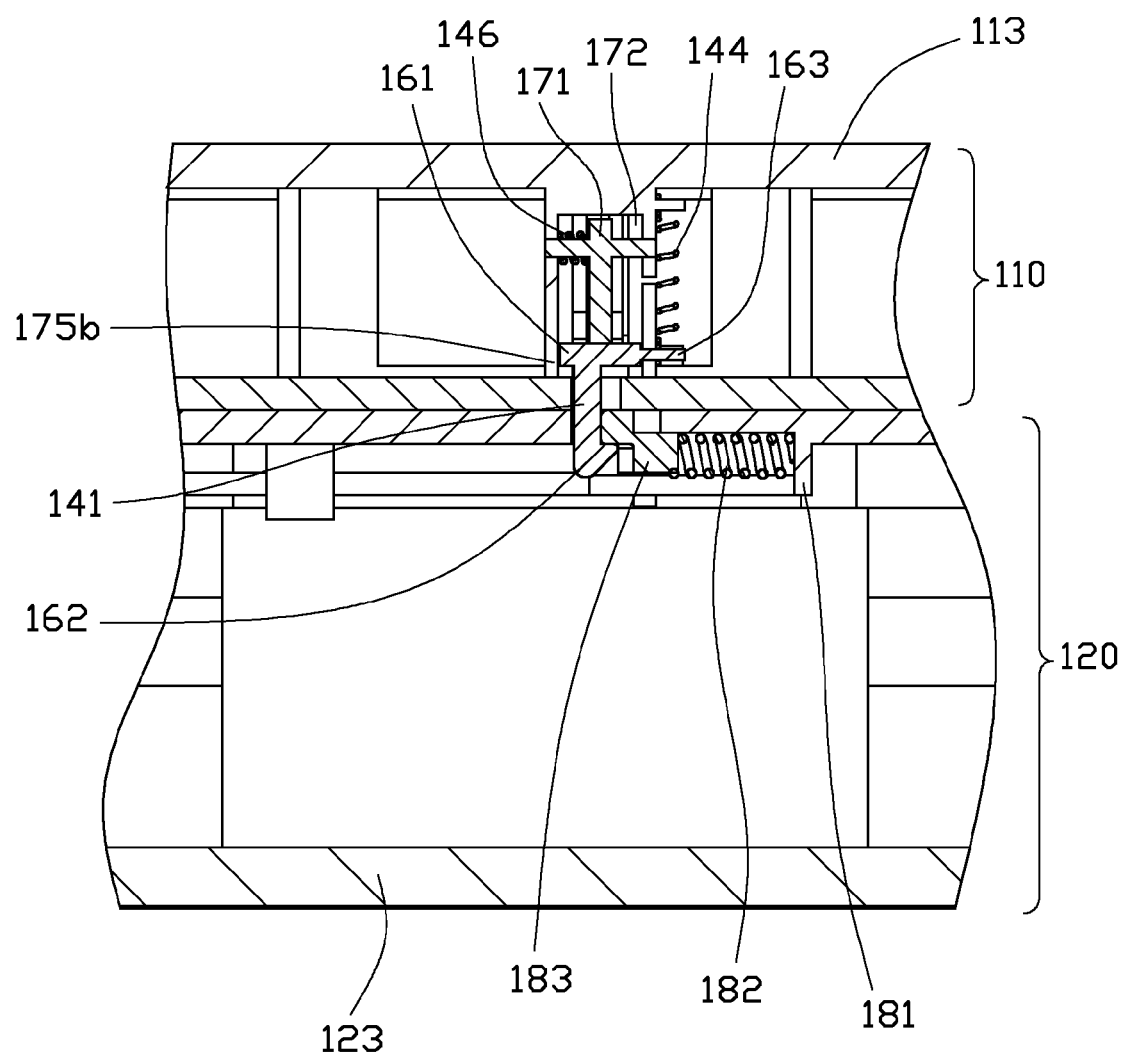
FIG. 7 is a cross-sectional view of the folding electronic device of FIG. 3 taken along line VII-VII.
Figure 8:
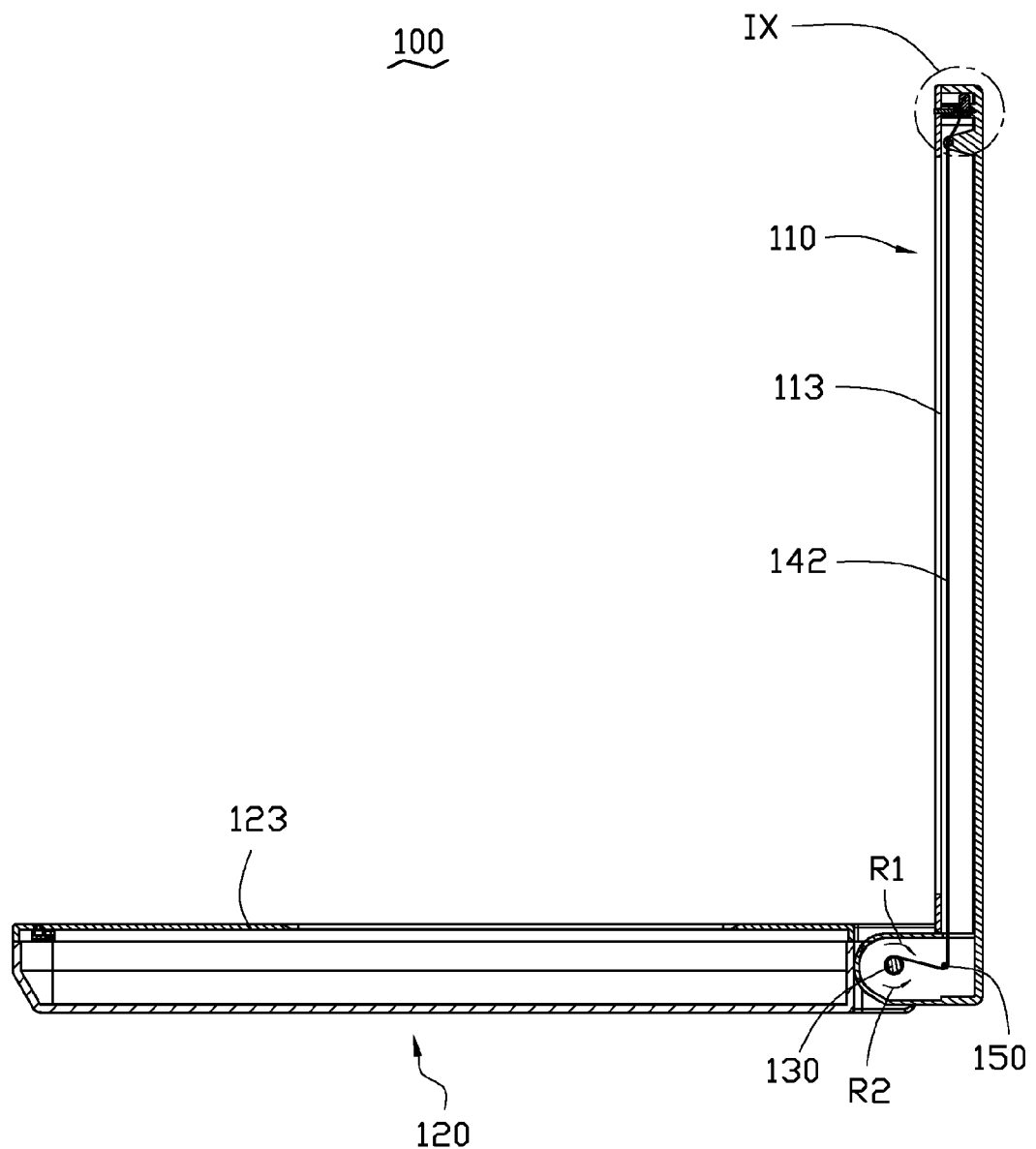
FIG. 8 is a cross-sectional view of the folding electronic device of FIG. 4 taken along line VIII-VIII.
Figure 9:
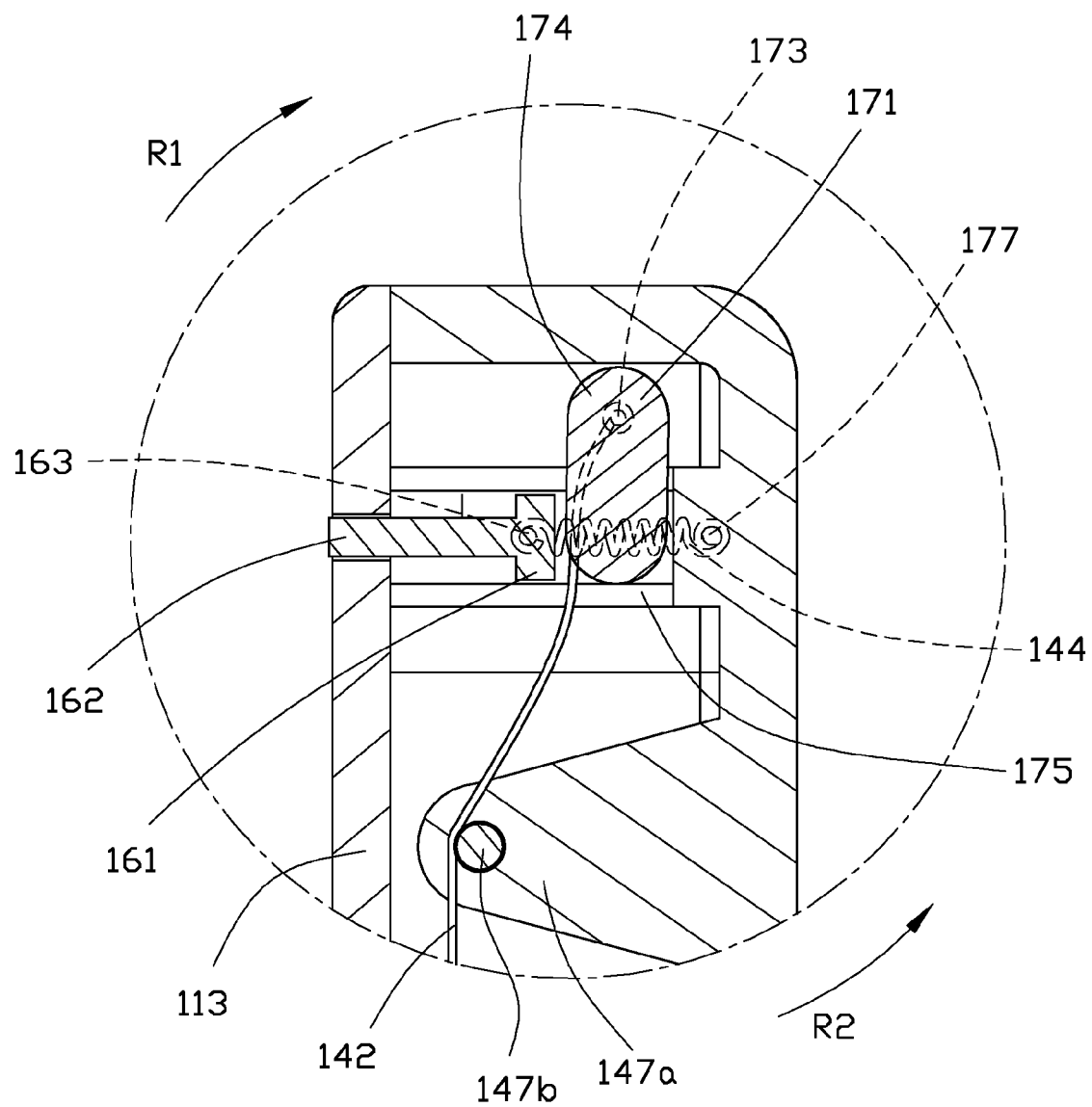
FIG. 9 is an enlarged view of part IX of the folding electronic device of FIG. 8.

FIGS. 7-9 show a cross-sectional view of the assembled locking mechanism 140. The flexible connection member 142 can be a strap. One end of the flexible connection member 142 is attached to the engagement 130, and the other end of the flexible connection member 142 is attached to the connection portion 173 of the hook driving member 143. The hook driving member 143 is positioned between the two fixing plates 175a and 175b, each of the two pivot shafts 172a and 172b passes through a pivot hole 176 such that the hook driving member 143 is pivotably engaged with the fixing member 145. The second reset driving member 146 can be a torsion spring, sleeved over the pivot shaft 172b. One end of the second reset driving member 146 is fixed with the engagement end 179 of the main portion 171, and the other end of the second reset driving member 146 is fixed with the adjacent fixing plate 176b.

The hook member 141 is positioned on the hook driving member 143, and the base portion 161 is positioned between the two fixing plates 175a and 175b. The first reset driving member 144 is connected between the hook member 141 and the fixing member 145. In one embodiment, the first reset driving member 144 is a spring, and each of the first connection portion 151 and the second connection portion 153 have the shape of a ring. The first connection portion 151 is sleeved over the fixing portion 177, and the second connection portion 153 is sleeved over the fixing portion 163. The locking mechanism 140 further includes a guide shaft 150. The guide shaft 150 is received in the first housing 111 and positioned at a side of the first housing 113 adjacent to the engagement unit 130. The guide member 147 and the guide shaft 150 are located between the fixing member 175 and the engagement unit 130 and are in contact with the flexible connection member 142 so as to guide the flexible connection member 142.

The elastic element 182 is a spring, and it is received in the guide groove 181a. One end of the elastic element 182 is connected to the positioning element 181, and the other end of the elastic element 182 is connected to the latch end 185 of the latch element 183. The engagement end 184 of the latch element 183 is engaged with the first end 193 of the link lever 192. The link lever 192 is received in the second housing 123, and passes through the guide hole 129 of the guide block 128. The inclined surface 195 of the second end 194 corresponds to the inclined surface 198 of the driving portion 197. The driving portion 197 is received in the second housing 123, and the operation end 196 passes through the opening 127 to be exposed from the second housing 123.

When the device 100 is in the folded state as shown in FIGS. 3 and 7, the first main body 110 is folded over the second main body 120, and the hook 162 protrudes out of the first housing 113 through the opening 116 to enable latching with the latch element 183 such that the first main body 110 and the second main body 120 are locked together by the locking mechanism 140. Further, the first reset driving member 144 and the second driving reset member 146 are compressed when the device 100 is in the folded state, and the flexible connection member 142 is wound around the engagement unit 130 and tightly stretched by the engagement unit 130 and the hook driving member 143.

Figure 10:
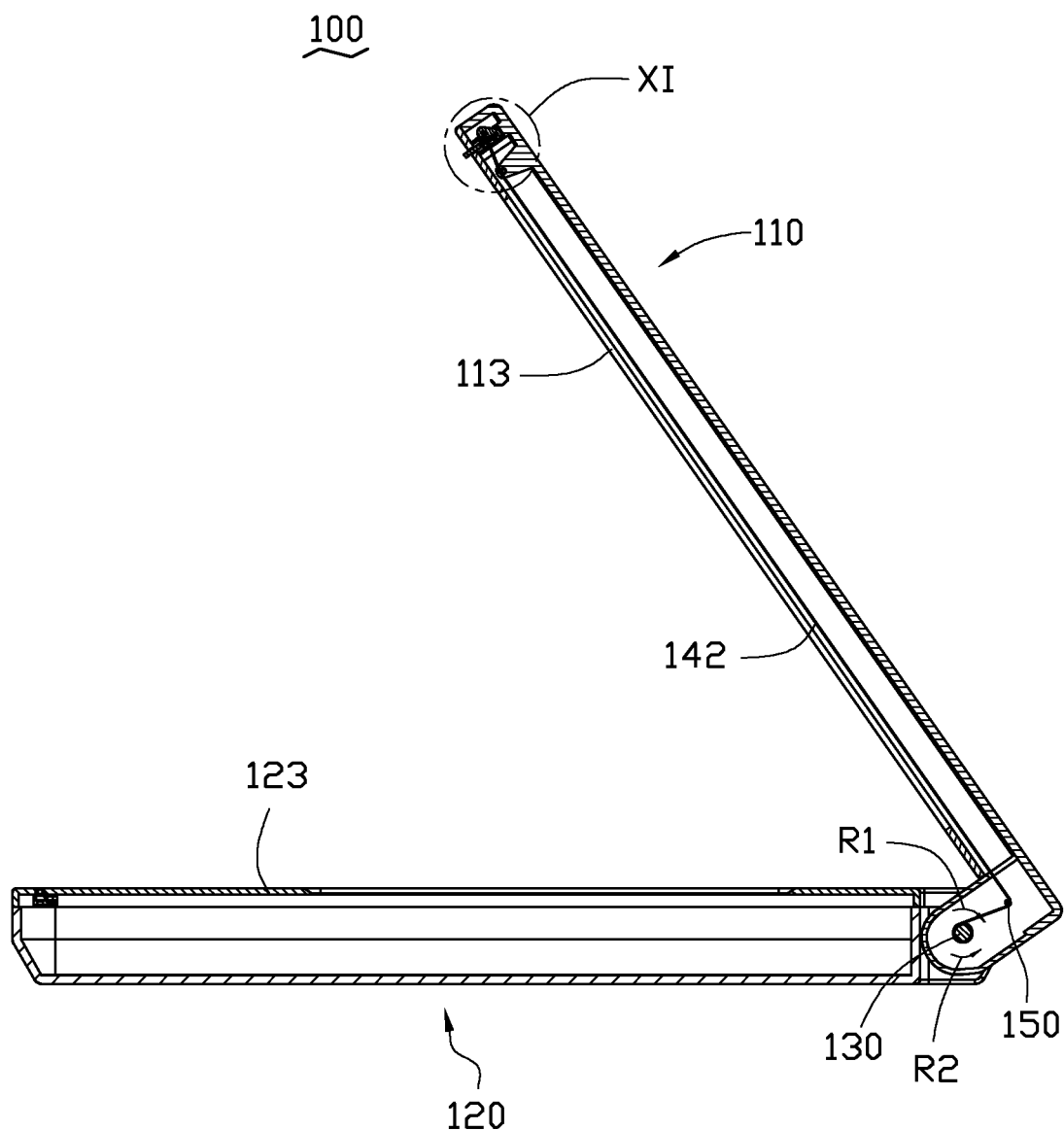
FIG. 10 is another cross-sectional view of the folding electronic device in a changing state between the folded state and the unfolded state.
Figure 11:
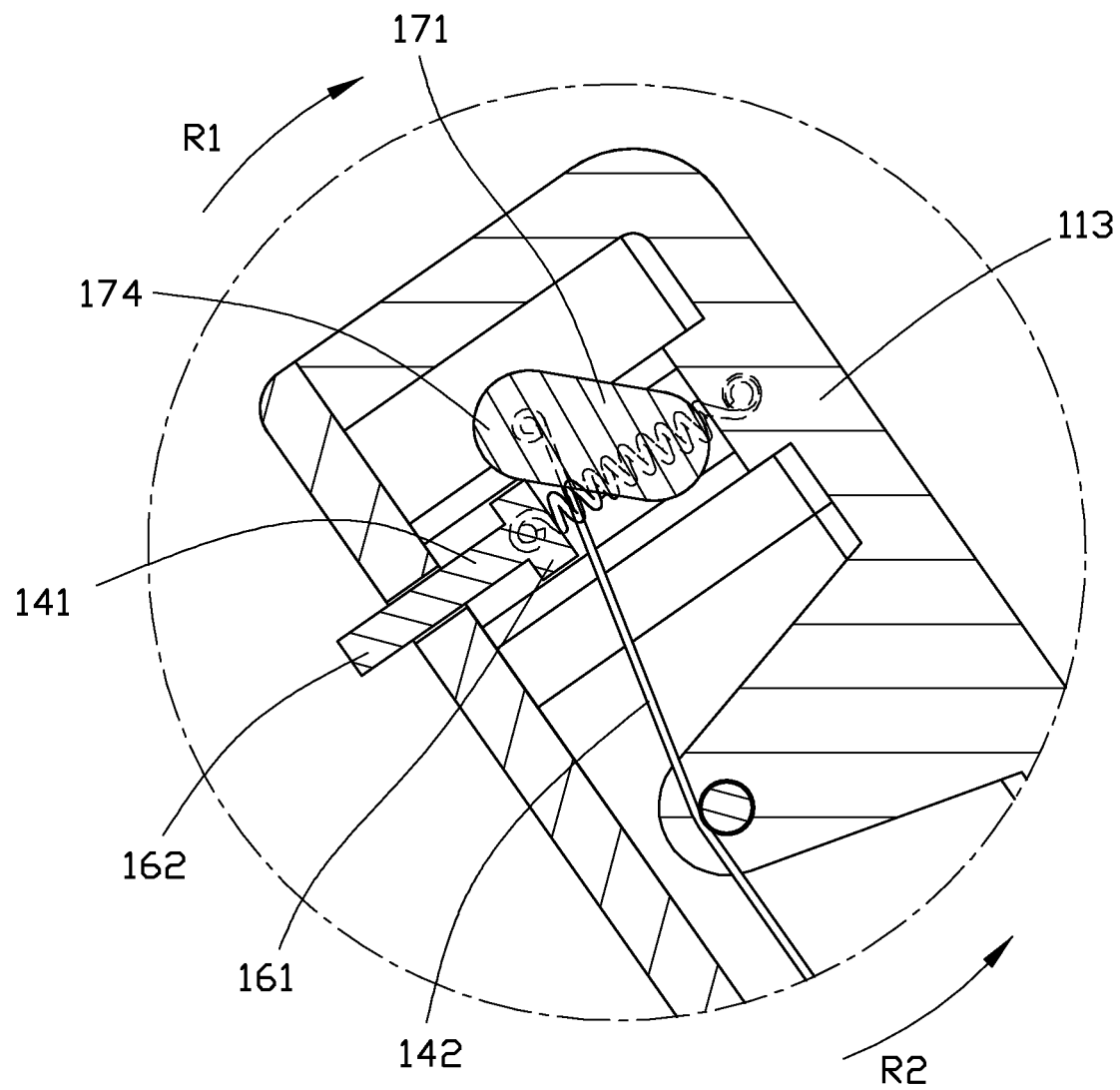
FIG. 11 is an enlarged view of part XI of the folding electronic device of FIG. 10.

Referring to FIGS. 6, 10 and 11, to unfold the device 100, the operation button 191 is pressed by a user along a first direction X, the inclined surface 198 of the driving portion 197 contacts the inclined surface 195 of the link lever 192 to drive the link lever 192 to move along a second direction Y. The second direction Y is perpendicular to the first direction X. However, in other embodiments, X and Y need not be perpendicular to each other. Accordingly, the hook 162 detaches from the latch element 183, and the elastic element 182 is compressed. After the first main body 110 is spread away from the second main body 120, the elastic element 182 restores to an uncompressed state so as to reset the latch element 182. Moreover, the engagement unit 130 rotates along a first rotating direction R1 to release the flexible connection member 142, and the flexible connection member 142 releases the hook driving member 143 such that the second driving reset member 146 restores and drives the hook driving member 143 to rotate along the rotating direction R1. Further, the first reset driving member 144 restores to an uncompressed state so as to retract the hook member 141 into the first housing 113. Thus, the hook member 141 becomes fully received and protected within the first housing 113 in the unfolded state.

When the device 100 has to be folded, the first main body 110 and the engagement unit 130 rotate along a rotating direction R2 opposite to the first rotating direction R1, and the flexible connection member 142 winds around the engagement unit 130, rotating the hook driving member 143 in the second rotating direction R2. Accordingly, the hook driving member 143 pushes out the hook member 141 so the hook member 141 protrudes from the first housing 113, such that the hook 162 is in position to latch with the latch member 183 once the device 100 has been fully folded.

The hook 162 is completely enclosed in the first housing 113 of the first main body 110 when the device 100 is unfolded, and thus incidental damage to locking mechanism is avoided and the reliability of the locking mechanism is improved.

It is to be further understood that even though numerous characteristics and advantages of preferred and exemplary embodiments have been set out in the foregoing description, together with details of the structures and functions of the embodiments, the disclosure is illustrative only; and changes may be made in detail, especially in the matters of shape, size and arrangement of parts within the principles of the present disclosure to the full extent indicated by the broad general meaning of the terms in which the appended claims are expressed.

What is claimed is:

1. A folding electronic device, comprising:
a first main body comprising a first housing;
an engagement unit;
a second main body pivotably engaged with the first main body via the engagement unit, the first main body being folded over the second main body when the folding electronic device is in a folded state, the first main body being away from the second main body when the folding electronic device is in an unfolded state; and
a locking mechanism configured to lock the first main body and the second main body together in the unfolded state, the locking mechanism comprising a hook member, a hook driving member, a first reset driving member, and a latch member, the hook member being fixed to the first main body and at least partly received in the first housing, the latch member being fixed to the second main body and configured to latch with the hook member in the folded state, the hook driving member being fixed to the first main body, one end of the first reset driving member being fixed to the first main body, the other end of the first reset driving member being fixed to the hook member,
wherein the locking mechanism further comprises a flexible connection member connected between the engagement unit and the hook driving member, and the flexible connection member is wound around the engagement unit to drive the hook driving member to push the hook member when the folding electronic device changes to the folded state from the unfolded state;

wherein the first reset driving member comprises an elastic element, one end of the elastic element is fixed to the first main body, and the other end of the elastic element is fixed to the hook member, and the hook member comprises a base portion, a hook extending from the base portion, and a first fixing portion connected to the base portion, and the elastic element comprises a first connection portion fixed to the first main body, a second connection portion fixed to the first fixing portion, and an elastic portion connected between the first connection portion and the second connection portion;

wherein the locking mechanism further comprises a fixing member and a second reset driving member, the fixing member is located at the first housing and configured to fix the hook driving member, the second reset driving member is configured to drive the hook driving member to reset such that the hook driving member retracts the hook member;

wherein when the folding electronic device changes to the folded state from the unfolded state, the hook driving member pushes the hook member to protrude from the first housing, when the folding electronic device changes to the unfolded state from the folded state, the first reset driving member retracts the hook member into the first housing.

2. The folding electronic device of claim 1, wherein the hook driving member comprises a main portion, two pivot shafts, and a third connection portion, the main portion comprising a push end and an opposite engagement end, the two pivot shafts being located at two opposite sides of the engagement end and configured to pivotably engaged with the fixing member, the third connection portion being located at the push end and attached to the flexible connection member, and the push end configured to push the hook member.

3. The folding electronic device of claim 2, wherein the fixing member comprises two parallel fixing plates extending from the first housing and a second fixing portion located at one of the fixing plates, each fixing plate defining a pivot hole configured to engage with the corresponding one pivot shaft of the hook driving member, the hook driving member and the base portion of the hook member being positioned between the two fixing plate, and the second fixing portion being connected to the first connection portion of the elastic element.

4. The folding electronic device of claim 3, the second reset driving member comprises a torsion spring sleeved over one of the pivot shafts, one end of the torsion spring being fixed with the engagement end of the main portion, and the other end of the torsion spring being fixed with the adjacent fixing plate.

5. The folding electronic device of claim 3, wherein the one of the fixing plates further defines a guide groove, the first fixing portion of the hook member slides in the guide groove when the folding electronic device changes state.

6. The folding electronic device of claim 3, wherein each of the first fixing portion and the second fixing portion are a fixing shaft, the elastic element is a spring, the first connection portion and the second connection portion are ring shaped, the first connection portion is sleeved over the second fixing portion, and the second connection portion is sleeved over the first fixing portion.

7. The folding electronic device of claim 1, wherein the locking mechanism further comprises a guide member fixed to the first housing, and the flexible connection member is guided by the guide member and is attached to the engagement unit.

8. The folding electronic device of claim 7, wherein the guide member comprises two supporting plates facing each other and a first guide shaft connecting the two supporting plates, and the first guide shaft contacting and guiding the guide member.

9. The folding electronic device of claim 8, the locking mechanism further comprises a second guide shaft adjacent to the engagement unit, and the flexible connection member is further guided by the second guide shaft.

10. The folding electronic device of claim 1, the locking mechanism further comprises an unlocking member, the unlocking member configured to drive the latch member to release the hook member when the unlocking member is operated.

11. The folding electronic device of claim 10, wherein the latch member comprises a latch element, an elastic element, and a positioning element, the latch element comprising a latch end configured to latch with the hook member and an engagement end configured to connect to the unlocking member, the positioning element configured to position the latch element, one end of the elastic element being connected to the positioning element, the other end of the elastic element being connected to the latch element, and the elastic element configured to drive the latch member to reset when the unlocking member is not operated.

12. The folding electronic device of claim 11, wherein the unlocking member comprises an operation button and a link lever, the link lever comprising a first end and an opposite second end, the first end being engaged with the engagement end of the latch element, the second end configured to be driven by the operation button.

13. The folding electronic device of claim 12, wherein the unlocking member further comprises a positioning element defining a guide hole, the link lever passes through the guide hole.

14. The folding electronic device of claim 13, wherein the second main body comprises a second housing, the latch member being received in the second housing, the second housing comprising a first opening, and the hook member passing through the first opening to latch with the latch member in the folded state.

15. The folding electronic device of claim 14, the operation button comprising an operation portion and a driving portion, the operation portion being exposed from an second opening of the second housing, the driving portion comprising a first inclined surface, and the second end of the link lever comprising a second inclined surface corresponding to the first inclined surface.

16. A folding electronic device, comprising:
a first main body comprising a first housing;
an engagement unit;
a second main body pivotably engaged with the first main body via the engagement unit, the first main body being folded over the second main body when the folding electronic device is in a folded state, the first main body being spread away from the second main body when the folding electronic device is in an unfolded state; and
a locking mechanism configured to lock the first main body and the second main body together in the unfolded state, the locking mechanism comprising a hook member, a hook driving member, a reset driving member, and a latch member, the hook member being fixed to the first main body and at least partly received in the first housing, the latch member being fixed to the second main body and configured to latch with the hook member in the folded state, the hook driving member being fixed to the first main body, the hook driving member configured to drive the hook member to protrude from the first housing to latch with the latch member, and the reset driving member configured to retract the hook member into the first housing after the latch member detaches from the hook member,
wherein the locking mechanism further comprises a fixing member and a second reset driving member, the fixing member is located at the first housing and configured to fix the hook driving member, the second reset driving member is configured to drive the hook driving member to reset such that the hook driving member retracts the hook member.

* * * * *